(12) United States Patent
Nakajima

(10) Patent No.: US 10,784,844 B2
(45) Date of Patent: Sep. 22, 2020

(54) FRACTIONAL FREQUENCY DIVIDER AND FREQUENCY SYNTHESIZER

(71) Applicant: CANON KABUSHIKI KAISHA, Tokyo (JP)

(72) Inventor: Yuji Nakajima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/775,675

(22) Filed: Jan. 29, 2020

(65) Prior Publication Data

US 2020/0266806 A1 Aug. 20, 2020

(30) Foreign Application Priority Data

Feb. 15, 2019 (JP) ................................. 2019-025789

(51) Int. Cl.
| | |
|---|---|
| *H03L 7/093* | (2006.01) |
| *H03L 7/099* | (2006.01) |
| *H03L 7/197* | (2006.01) |
| *H03K 5/00* | (2006.01) |
| *H03K 3/037* | (2006.01) |
| *H02M 3/07* | (2006.01) |

(52) U.S. Cl.
CPC ......... *H03K 5/00006* (2013.01); *H03K 3/037* (2013.01); *H03L 7/093* (2013.01); *H03L 7/099* (2013.01); *H02M 3/07* (2013.01)

(58) Field of Classification Search
CPC combination set(s) only.
See application file for complete search history.

(56) References Cited

U.S. PATENT DOCUMENTS

| | | | |
|---|---|---|---|
| 9,484,939 B2 * | 11/2016 | Luo | ............................ G06F 1/04 |
| 10,116,315 B1 * | 10/2018 | Zhuang | ................. H03L 7/0992 |
| 10,396,808 B2 * | 8/2019 | Sun | .......................... H03L 7/197 |
| 2016/0087636 A1 | 3/2016 | Lai et al. | |

* cited by examiner

*Primary Examiner* — An T Luu
(74) *Attorney, Agent, or Firm* — Carter, DeLuca & Farrell LLP

(57) ABSTRACT

A fractional frequency divider comprises: a fractional frequency divider circuit configured to, by using an integer frequency division signal obtained by dividing an input signal by an integer frequency division ratio, generate a fractional frequency division signal into which the input signal is divided by a fraction frequency division ratio; a latch circuit configured to capture a frequency control signal representing a specified fraction frequency division ratio in synchronization with the fractional frequency division signal; and a control circuit configured to generate an integer control signal for setting an integer frequency division ratio corresponding to a specified fraction frequency division ratio in synchronization with an integer frequency division signal, based on a captured frequency control signal. The fractional frequency divider circuit updates the integer frequency division ratio by referring to the integer control signal in synchronization with the input signal.

20 Claims, 7 Drawing Sheets

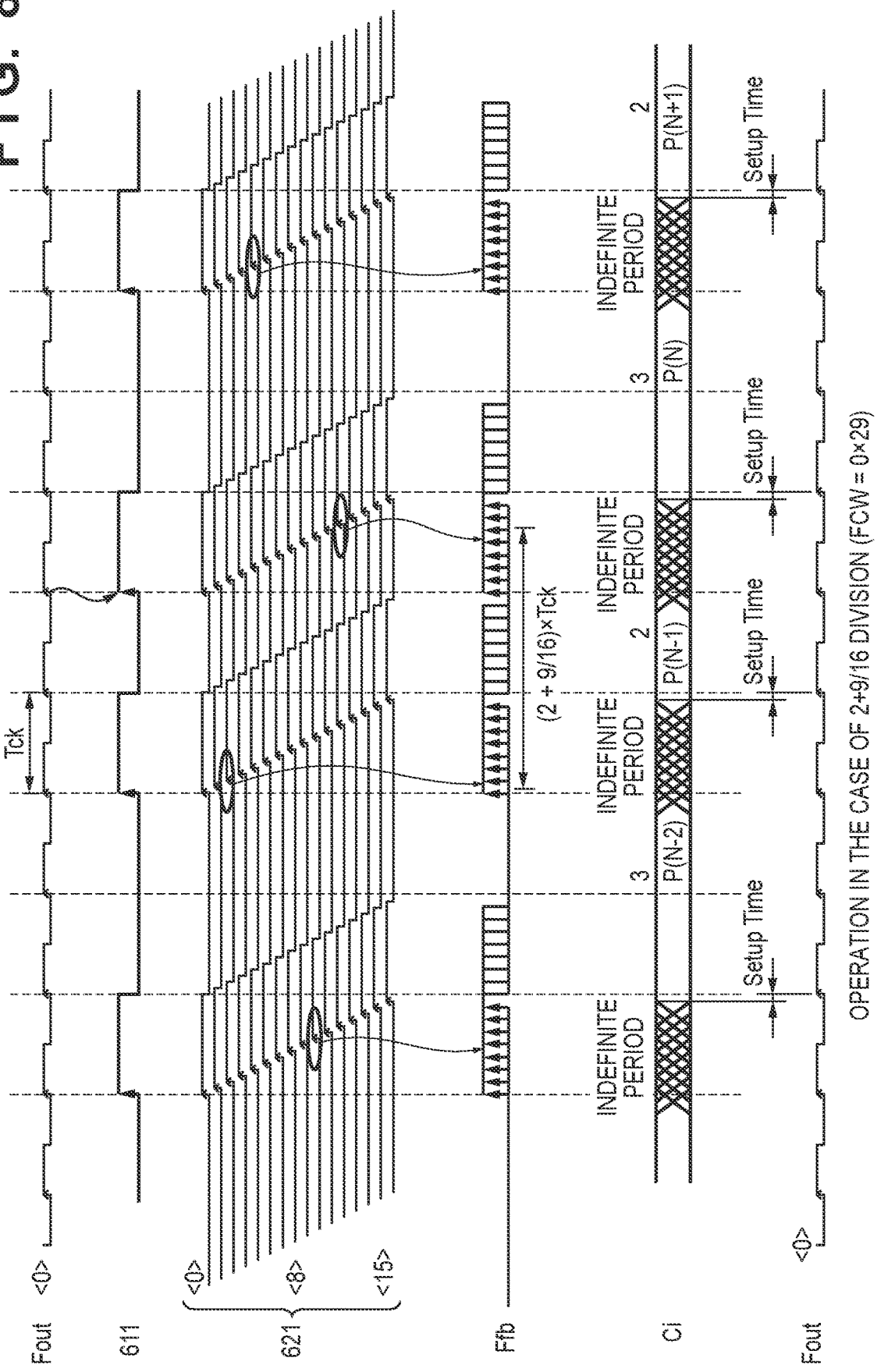

FRACTIONAL FREQUENCY DIVIDER AND FREQUENCY SYNTHESIZER

BACKGROUND OF THE INVENTION

Field of the Invention

The present invention relates to a fractional frequency divider and a frequency synthesizer.

Description of the Related Art

US-2016-0087636 describes a conventional fractional frequency divider. FIG. 7 is a block diagram illustrating a frequency synthesizer equipped with a conventional fractional frequency divider. The frequency synthesizer includes a frequency divider 610, a sampler 620, a selector 630, an oscillator 640, a delta-sigma modulator 651, and an adder 652. An output terminal of the adder 652 outputs an integer code Ci and a fraction code Cf. The fraction code Cf is supplied to the control terminal of the selector 630. The integer code Ci is provided to the frequency divider 610.

The frequency divider 610 divides the frequency of a clock signal Fout by an integer value represented by the integer code Ci, and determines the frequency of the clock signal 611. For example, when the integer value represented by the integer code Ci is 2 and the frequency of the clock signal Fout is f, the frequency of the frequency-divided clock signal 611 becomes f/2. The sampler 620 fine-tunes the phase of the frequency-divided clock signal 611 according to the fraction code Cf, and the selector 630 outputs the fine-tuned frequency-divided clock 621 as a feedback signal Ffb. The feedback signal Ffb is returned to the phase comparator 631, and the feedback signal Ffb is compared with the reference signal Fref.

FIG. 8 is an operation waveform diagram of a frequency synthesizer equipped with a conventional fractional frequency divider. The oscillator 640 outputs a multi-phase sampling clock signal Fs to the sampler 620. FIG. 8 illustrates a case where the number of phases of the sampling clock signal Fs is 16. The frequency divider 610 divides the clock signal Fout by an integer number and outputs the clock signal 611. The sampler 620 outputs a multi-phase clock 621 obtained by delaying of the clock signal 611 by $1/16$th of the cycle for the respective phases. The selector 630 selects one phase of the multi-phase clock 621 and outputs the feedback signal Ffb, thereby realizing fractional division.

SUMMARY OF THE INVENTION

In the technique described in US-2016-0087636, the phase delay between the clock signal Fout and the feedback signal Ffb is a value between 0 and $15/16$ of a cycle counting in cycles of the clock signal Fout. Since the value of this phase delay is determined by the fraction code Cf, it changes in time. The integer code Ci is updated at the timing of the edge of the feedback signal Ffb. The frequency divider 610 references the integer code Ci at a timing of an edge of the clock signal Fout.

However, in the operation of the frequency divider 610, the timing relationship between the integer code Ci and the clock signal Fout needs to be satisfied for all the fraction codes Cf. Therefore, the integer code Ci becomes an indefinite value for a period over $15/16$ of a cycle counted in cycles of the clock signal Fout. The effective time when capturing the integer code Ci with the clock signal Fout is, at a minimum, only $1/16$ of a cycle. This makes timing design difficult. In particular, it is difficult to perform high-speed operation while maintaining operation stability.

Further, since the integer code Ci is a multi-bit bus signal, when a timing violation occurs, the setting value for the frequency division ratio is set to a value different from the intended value, and there is a possibility that a PLL will become unlocked. In particular, when the clock frequency is high and the number of clock phases is large, the above problem becomes conspicuous.

An embodiment of the present invention provides a technique by which it is possible to maintain or improve stability to operation while realizing high-speed operation by increasing the clock frequency when performing fractional division.

As a means for solving the above problems, one embodiment of the present invention has the following configuration.

A fractional frequency divider, comprising: a fractional frequency divider circuit configured to, by using an integer frequency division signal obtained by dividing an input signal by an integer frequency division ratio, generate a fractional frequency division signal into which the input signal is divided by a fraction frequency division ratio; a latch circuit configured to capture a frequency control signal representing a specified fraction frequency division ratio in synchronization with the fractional frequency division signal; and a control circuit configured to generate an integer control signal for setting an integer frequency division ratio corresponding to a specified fraction frequency division ratio in synchronization with an integer frequency division signal, based on a captured frequency control signal, wherein the fractional frequency divider circuit is configured to update the integer frequency division ratio by referring to the integer control signal in synchronization with the input signal.

By virtue of embodiments of the present invention, it is possible to maintain or improve stability of operation while realizing high-speed operation by increasing the clock frequency when performing fractional division.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 8 is an operation waveform diagram of the frequency synthesizer equipped with a conventional fractional frequency divider.

DESCRIPTION OF THE EMBODIMENTS

Figure 1:
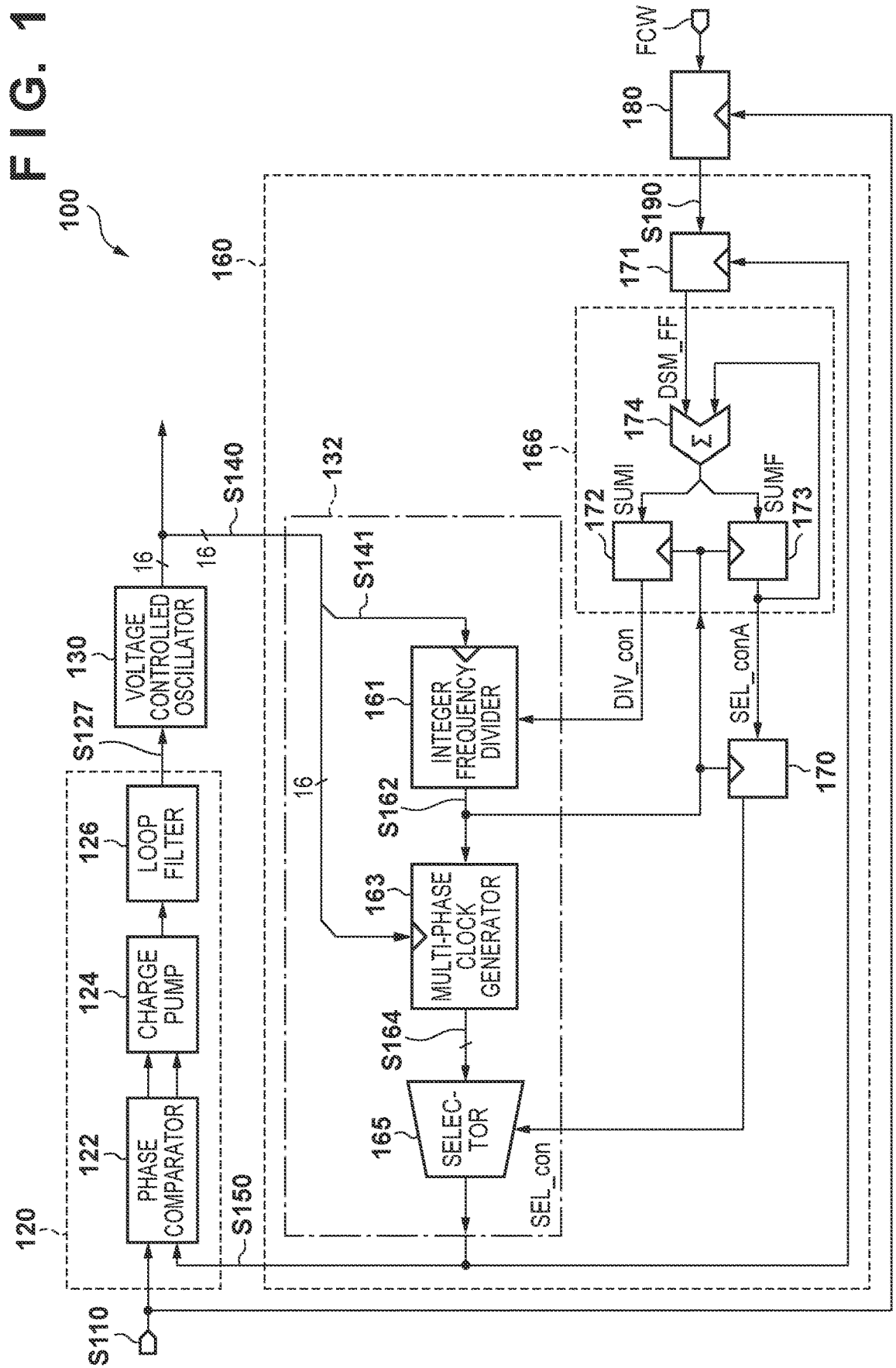
FIG. 1 is a block diagram illustrating a function and a configuration of a frequency synthesizer according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In embodiments, in a fractional frequency divider which performs a frequency dividing operation at a fraction frequency division ratio in relation to an input clock frequency based on a frequency control word, the frequency division ratio is updated by capturing the frequency control word in synchronization with a fractional frequency division signal divided by the fraction frequency division ratio. At this time, a control signal for setting the captured frequency division ratio is delayed in synchronization with a clock signal different from a fractional frequency division signal. Consequently, while the update of the frequency division ratio is somewhat delayed, design freedom with respect to timing by is improved in proportion to the delay, and design is facilitated. In particular, it enables sufficient time to set the integer frequency divider inside the fractional frequency divider. As a result, by virtue of embodiments, by sacrificing some responsiveness in relation to a frequency change, timing requirements can be relaxed and operation stability can be enhanced.

FIG. 1 is a block diagram illustrating a function and a configuration of a frequency synthesizer 100 according to embodiments. A frequency synthesizer 100 includes a reference signal terminal, an FCW terminal, a control voltage generation circuit 120, a voltage controlled oscillator 130, and a fractional frequency divider 160. A frequency control word FCW for specifying a fraction frequency division ratio is applied to the FCW terminal. A reference clock S110 is applied to the reference signal terminal as a reference signal. The frequency synthesizer 100 generates a fractional frequency division signal S150 divided by the fraction frequency division ratio specified by the frequency control word FCW.

The control voltage generation circuit 120 generates a VCO control signal S127 for controlling the voltage controlled oscillator 130 based on the reference clock S110 and the fractional frequency division signal S150. The control voltage generation circuit 120 includes a phase comparator 122, a charge pump 124, and a loop filter 126.

The phase comparator 122 is a comparison circuit that compares the phase of the reference clock S110 with the phase of the fractional frequency division signal S150. The phase comparator 122 detects a phase difference between the two signals by comparing the two signals. The charge pump 124 generates a current corresponding to the comparison result in the phase comparator 122. The charge pump 124 generates a pull current or a push current corresponding to the phase difference detected by the phase comparator 122. The loop filter 126 outputs an output signal, check grammar voltage level is controlled by the charging/discharging by the current generated by the charge pump 124, to the voltage controlled oscillator 130 as the VCO control signal S127.

The loop filter 126 controls charging/discharging by a pull current or a push current of the charge pump 124.

The voltage controlled oscillator 130 generates a multi-phase clock S140 for a frequency corresponding to the voltage of the VCO control signal S127, and outputs the multi-phase clock S140 to the fractional frequency divider 160. The voltage controlled oscillator 130 is configured to be capable of generating a multi-phase clock, for example, a 16-phase clock. The oscillation frequency of the voltage controlled oscillator 130 is controlled by the voltage of the VCO control signal S127.

The fractional frequency divider 160 divides an input clock S141 (input signal) of one predetermined phase of the multi-phase clock S140 (multi-phase clock signal) generated by the voltage controlled oscillator 130 by a fraction frequency division ratio specified by the frequency control word FCW, thereby generating the fractional frequency division signal S150. The fractional frequency divider 160 includes a selector 165, a multi-phase clock generator 163, an integer frequency divider 161, a first flip-flop 170, a second flip-flop 171, a phase accumulator 166, and a delta-sigma modulator 180.

The integer frequency divider 161 is an integer frequency divider circuit that generates an integer frequency division signal S162 by dividing the input clock S141 by an integer frequency division ratio represented by an integer code DIV_con (an integer control signal) provided by the phase accumulator 166. As will be described later, the integer frequency divider 161 is a multi-modulus type divider.

The multi-phase clock generator 163 is a multi-phase generation circuit that generates an internal multi-phase clock S164 (multi-phase signal) having the same frequency as the frequency of the integer frequency division signal S162 generated by the integer frequency divider 161 using the multi-phase clock S140.

The selector 165 is a selection circuit for generating the fractional frequency division signal S150 based on the internal multi-phase clock S164 generated by the multi-phase clock generator 163. The selector 165 generates the fractional frequency division signal S150 by selecting a signal from among the multi-phase signals based on the fraction code SEL_con (selection control signal) provided by the first flip-flop 170.

The integer frequency divider 161, the multi-phase clock generator 163, and the selector 165 constitute a fractional frequency divider circuit 132 that generates the fractional frequency division signal S150 obtained by dividing the input clock S141 by the integer frequency division ratio, using the integer frequency division signal S162 obtained by dividing the input clock S141 by the fraction frequency division ratio. The fractional frequency divider circuit 132 is configured to update the integer frequency division ratio by referring to the integer code DIV_con in synchronization with the input clock S141.

The delta-sigma modulator 180 converts the frequency control word FCW received from the FCW terminal into a frequency control signal S190, and outputs the frequency control signal S190 to the second flip-flop 171. The delta-sigma modulator 180 uses the reference clock S110 received from the reference signal terminal to perform the above conversion.

The second flip-flop 171 is a latch circuit that captures the frequency control signal S190 representing the fraction frequency division ratio specified by the frequency control word FCW in synchronization with the fractional frequency division signal S150. The frequency control signal S190 is applied to an input terminal of the second flip-flop 171, and the fractional frequency division signal S150 is applied to a clock terminal of the second flip-flop 171. The second flip-flop 171 outputs to the phase accumulator 166 a latch signal DSM_FF obtained as a result of sampling the frequency control signal S190 at the timings of the fractional frequency division signal S150.

The phase accumulator 166 is a control circuit that generates an integer code DIV_con for setting an integer frequency division ratio corresponding to the fraction frequency division ratio specified by the frequency control word FCW based on the latch signal DSM_FF in synchronization with the integer frequency division signal S162. In addition, the phase accumulator 166 generates an internal fraction code SEL_conA for selecting a signal having a phase corresponding to the specified fraction frequency division ratio of the internal multi-phase clock S164 based on the latch signal DSM_FF in synchronization with the integer frequency division signal S162. The phase accumulator 166 outputs the integer code DIV_con to the integer frequency divider 161, and outputs the internal fraction code SEL_conA to the first flip-flop 170.

The phase accumulator 166 is configured to delay the integer code DIV_con in synchronization with the integer frequency division signal S162 and to delay the internal fraction code SEL_conA in synchronization with the integer frequency division signal S162. In particular, the phase accumulator 166 is configured such that the specified fraction frequency division ratio is reflected in the fractional frequency division signal S150 with a delay of at least one cycle in cycles of the fractional frequency division signal S150 after the second flip-flop 171 captures the frequency control signal S190.

The phase accumulator 166 includes a third flip-flop 172, a fourth flip-flop 173, and an adder 174. The adder 174 adds the latch signal DSM_FF and the internal fraction code SEL_conA. The adder 174 outputs the integer part of the addition result to the third flip-flop 172 as the integer part output code SUMI. The adder 174 outputs the fractional part of the addition result to the fourth flip-flop 173 as the fractional part output code SUMF. The third flip-flop 172 is clocked by the integer frequency division signal S162, delays the integer part output code SUMI in synchronization with the integer frequency division signal S162, and outputs the integer code DIV_con. The fourth flip-flop 173 is clocked by the integer frequency division signal S162, delays the fractional part output code SUMF in synchronization with the integer frequency division signal S162, and outputs the internal fraction code SEL_conA.

The first flip-flop 170 is clocked by the integer frequency division signal S162, delays the internal fraction code SEL_conA in synchronization with the integer frequency division signal S162, and outputs it as the fraction code SEL_con to the selector 165.

In the frequency synthesizer 100 illustrated in FIG. 1, the fractional frequency division signal S150 is returned to the phase comparator 122 and compared with the reference clock S110. The frequency of the voltage controlled oscillator 130 is controlled so that the phase difference between the reference clock S110 and the fractional frequency division signal S150 becomes zero. As described above, the frequency synthesizer 100 has a phase-locked loop (PLL) configuration.

Figure 2:
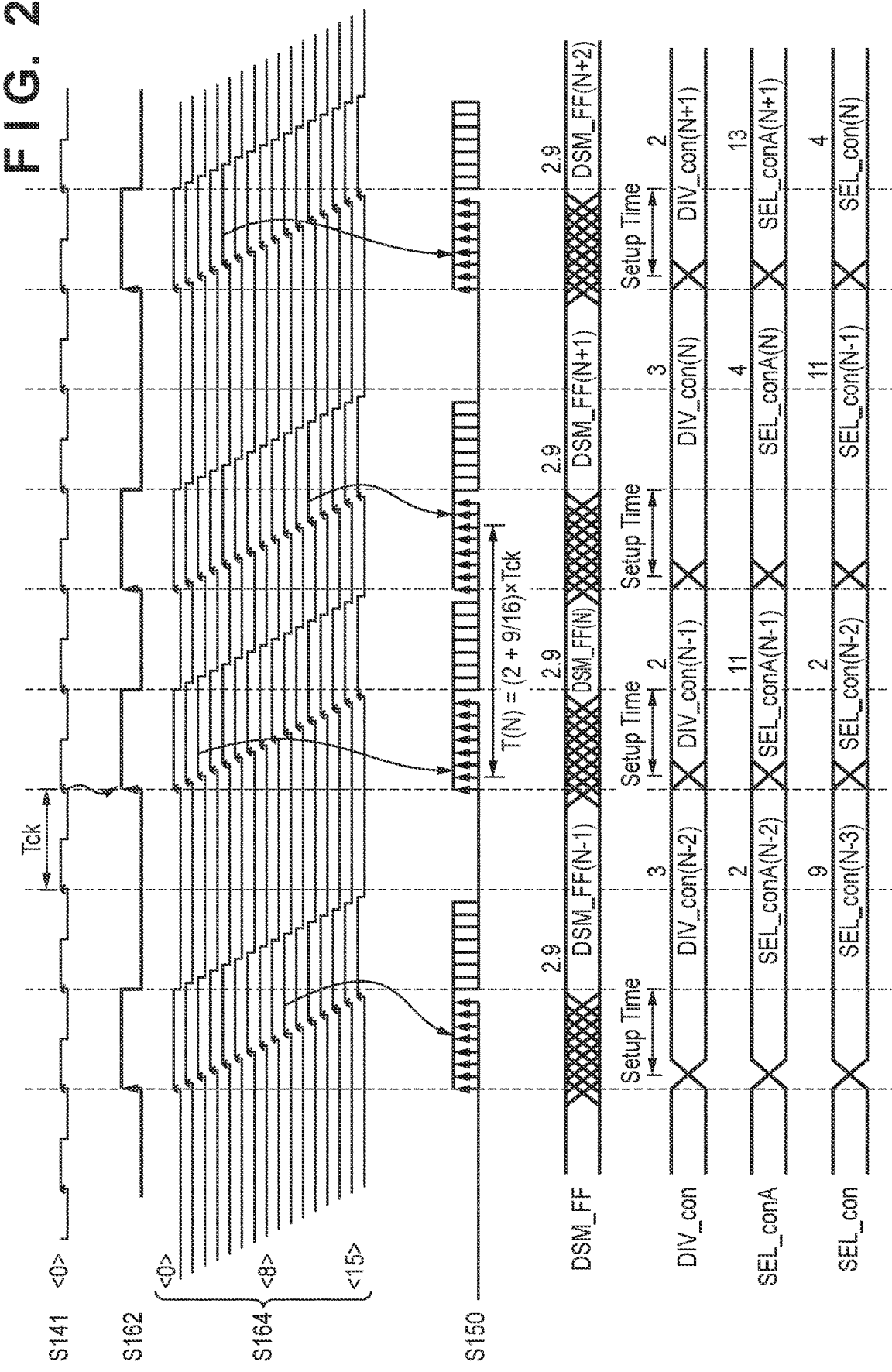
FIG. 2 is an operation waveform diagram of the frequency synthesizer of FIG. 1.

FIG. 2 is an operation waveform diagram of the frequency synthesizer 100 of FIG. 1. FIG. 2 illustrates a case where the number of phases of the multi-phase clock S140 is 16. The input clock S141 is input to the integer frequency divider 161. The input clock S141 is a clock signal having a cycle Tck. The integer frequency divider 161 divides the frequency of the input clock S141 by an integer value represented by the integer code DIV_con, and outputs the integer frequency division signal S162. The integer code DIV_con determines the frequency of the integer frequency division signal S162. For example, when the value represented by the integer code DIV_con is 2 and the frequency of the input clock S141 is f, the frequency of the integer frequency division signal S162 obtained as a result of the frequency division becomes f/2.

The multi-phase clock generator 163 latches the integer frequency division signal S162 by the multi-phase clock S140, thereby generating and outputting the internal multi-phase clock S164. When the number of phases of the multi-phase clock S140 is 16, the internal multi-phase clock S164 is a 16-phase clock whose phases are respectively shifted by $\frac{1}{16}$ Tck. The multi-phase clock generator 163 outputs the internal multi-phase clock S164 at the same frequency as the output of the integer frequency divider 161 based on the multi-phase clock S140.

The selector 165 selects one phase of the internal multi-phase clock S164 based on the fraction code SEL_con, and outputs the fractional frequency division signal S150. This realizes fractional division of the input clock S141.

The second flip-flop 171 generates the latch signal DSM_FF by latching the frequency control signal S190 received from the delta-sigma modulator 180 at the edges of the fractional frequency division signal S150, and outputs the latch signal DSM_FF to the phase accumulator 166. For example, when 0x29 is applied to the frequency control word FCW, the latch signal DSM_FF becomes 2.9.

The adder 174 of the phase accumulator 166 outputs a value obtained by adding the latch signal DSM_FF received from the second flip-flop 171 and the value of the fractional part output code SUMF one cycle earlier in the cycles of the integer frequency division signal S162 (i.e., the internal fraction code SEL_conA). The integer part of this output is the integer part output code SUMI, and the fractional part is the fractional part output code SUMF. The integer part output code SUMI is delayed by the third flip-flop 172 by one cycle in cycles of the integer frequency division signal S162, and is output as the integer code DIV_con. The fractional part output code SUMF is delayed by the fourth flip-flop 173 by one cycle in cycles of the integer frequency division signal S162, and is output as the internal fraction code SEL_conA. The phase accumulator 166 updates the outputs based on the timing of the integer frequency division signal S162.

The first flip-flop 170 latches the internal fraction code SEL_conA received from the phase accumulator 166 at the edge of the integer frequency division signal S162 to generate the fraction code SEL_con, and outputs the fraction code SEL_con to the selector 165. That is, the first flip-flop 170 further delays the fractional part output code SUMF by one cycle in cycles of the integer frequency division signal S162.

Based on the fraction code SEL_con, the selector 165 selects one phase from the internal multi-phase clock S164, and outputs the fractional frequency division signal S150. In the example of FIG. 2, CLK[9] is selected in the period SEL_con(N−3), CLK[2] is selected in the period SEL_con(N−2), CLK[11] is selected in the period SEL_con(N−1), and CLK[4] is selected in the period SEL_con(N). Since DIV_con(N−1) is 2, the input clock S141 is divided by 2 during DIV_con(N−1) to generate the integer frequency division signal S162. That is, the cycle of the integer frequency division signal S162 is 2Tck. Since SEL_con(N−

1) is 11 and SEL_con(N−2) is 2, the time between the rising edge of the fractional frequency division signal S150 in the period of SEL_con(N−2) and the rising edge of the fractional frequency division signal S150 in the period of SEL_con(N−1) is (2+9/16)×Tck. In this way, the input clock S141 is divided by the values given to the frequency control word FCW, and the fractional frequency division signal S150 is generated and outputted.

Figure 3:
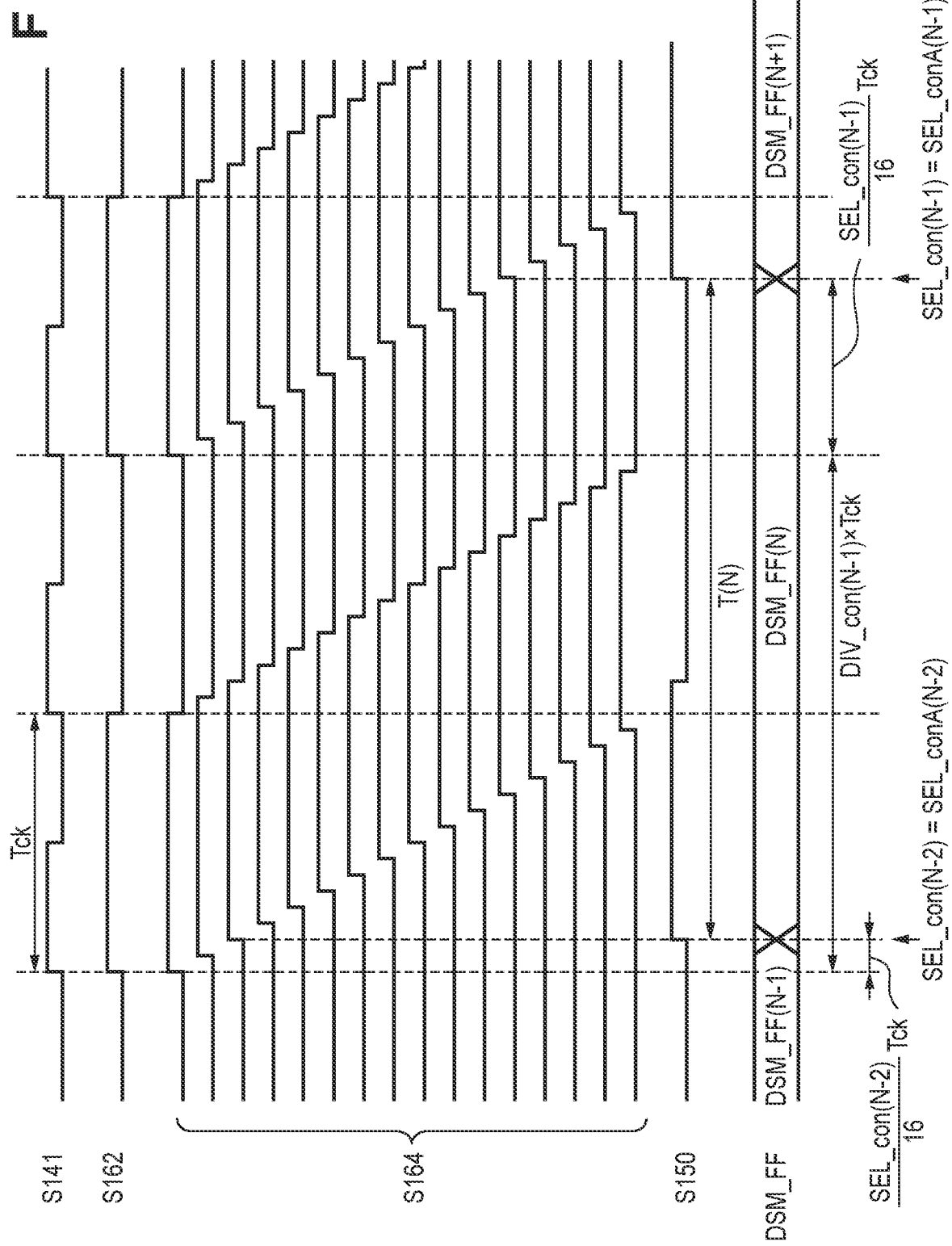
FIG. 3 is a diagram for explaining a correspondence between a cycle of a fractional frequency division signal and a latch signal.

FIG. 3 is a diagram for explaining a correspondence between the cycles of the fractional frequency division signal S150 and the latch signal DSM_FF. FIG. 3 corresponds to FIG. 2. As illustrated in FIGS. 2 and 3, T(N), DSM_FF(N), DIV_con(N), SEL_conA(N), and SEL_con(N) are defined (N is a natural number). DIV_con(N), SEL_conA(N), and SEL_con(N) are hexadecimal integers, respectively, and DSM_FF(N) is a hexadecimal number up to the first fractional place. As illustrated in FIG. 3, T(N) is expressed as follows:

$$T(N)=DIV\_con(N-1)\times Tck+SEL\_con(N-1)\times Tck/16-SEL\_con(N-2)\times Tck/16 \quad \text{(Equation 1)}$$

Here, the calculation in the phase accumulator 166 is expressed as follows.

$$DSM\_FF(N-1)+0\cdot SEL\_conA(N-2)=DIV\_con(N-1)\cdot SEL\_conA(N-1)$$

In base 10 notation, $$DSM\_FF(N-1)+SEL\_conA(N-2)/16=DIV\_con(N-1)+SEL\_conA(N-1)/16 \quad \text{(Equation 2)}$$

From Equations 1 and 2:

$$T(N)/Tck=DIV\_con(N-1)+SEL\_con(N-1)/16-SEL\_con(N-2)/16=DIV\_con(N-1)+SEL\_conA(N-1)/16-SEL\_conA(N-2)/16=DSM\_FF(N-1)+SEL\_conA(N-2)/16-SEL\_conA(N-2)/16=DSM\_FF(N-1)$$

That is, the cycle of the fractional frequency division signal S150 is the cycle specified by the latch signal DSM_FF one cycle earlier. In another embodiment, instead of the phase accumulator 166 and the first flip-flop 170, another circuit configuration that realizes the above relation between the latch signal DSM_FF and the cycle of the fractional frequency division signal S150 may be adopted. In still another embodiment, the delay amount until the cycle specified by the latch signal DSM_FF is reflected in the fractional frequency division signal S150 may be set to two or more periods.

Figure 4:
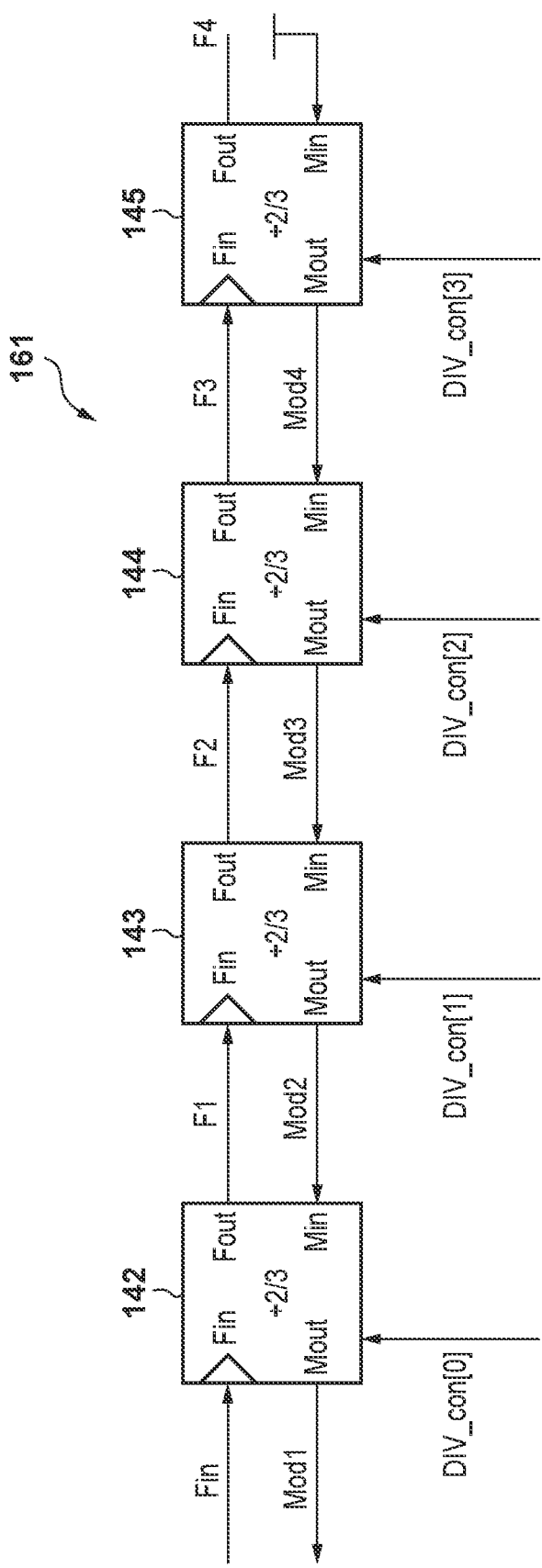
FIG. 4 is a block diagram illustrating a configuration of an integer frequency divider of FIG. 1.

FIG. 4 is a block diagram illustrating a configuration of the integer frequency divider 161 of FIG. 1. The integer frequency divider 161 is a multi-modulus type frequency divider, and has a configuration in which variable frequency dividers 142, 143, 144, and 145 are cascaded. The multi-modulus type frequency divider can operate at high speed and in response to a wide frequency division ratio.

Figure 5:
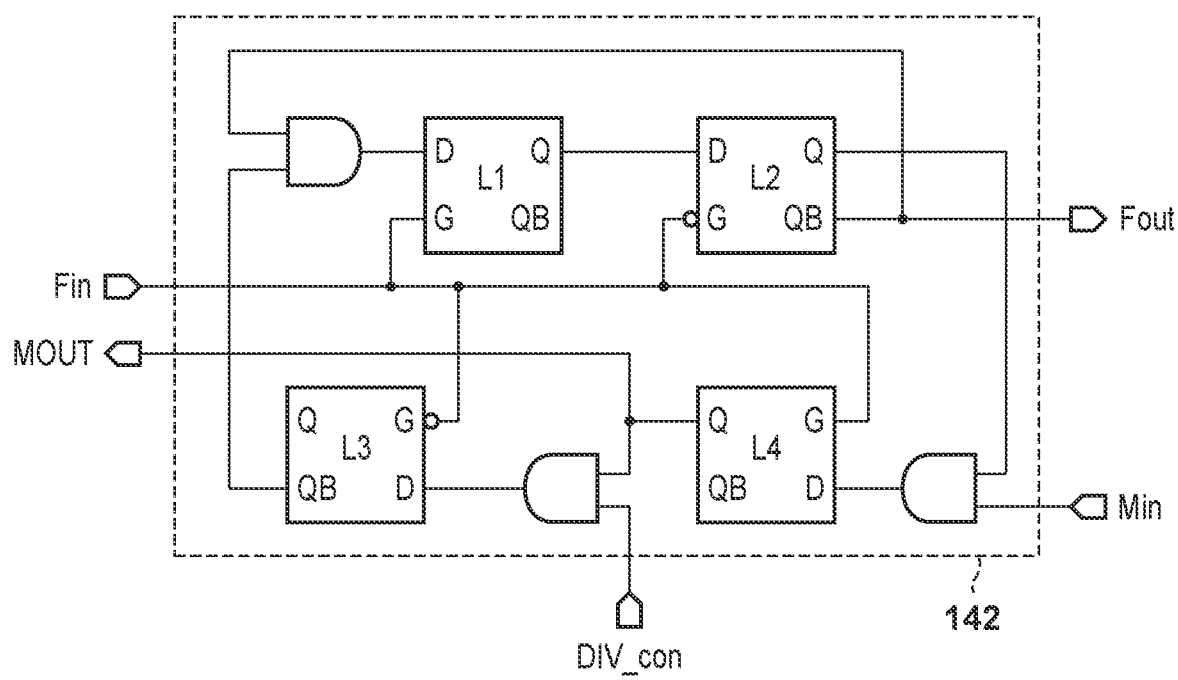
FIG. 5 is a circuit diagram of a variable frequency divider of FIG. 4.

FIG. 5 is a circuit diagram of the variable frequency divider 142 of FIG. 4. The variable frequency divider 142 operates by switching between frequency division by two and frequency division by three in accordance with the value of the integer code DIV_con. The other variable frequency dividers 143, 144, and 145 are similarly configured.

Figure 6:
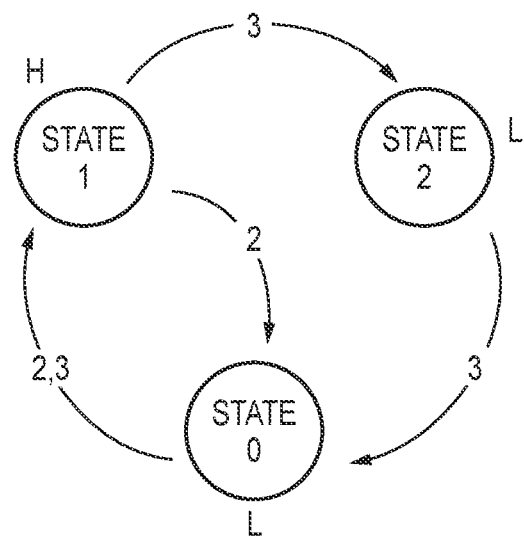
FIG. 6 is a state transition diagram of the integer frequency divider of FIG. 1.
Figure 7:
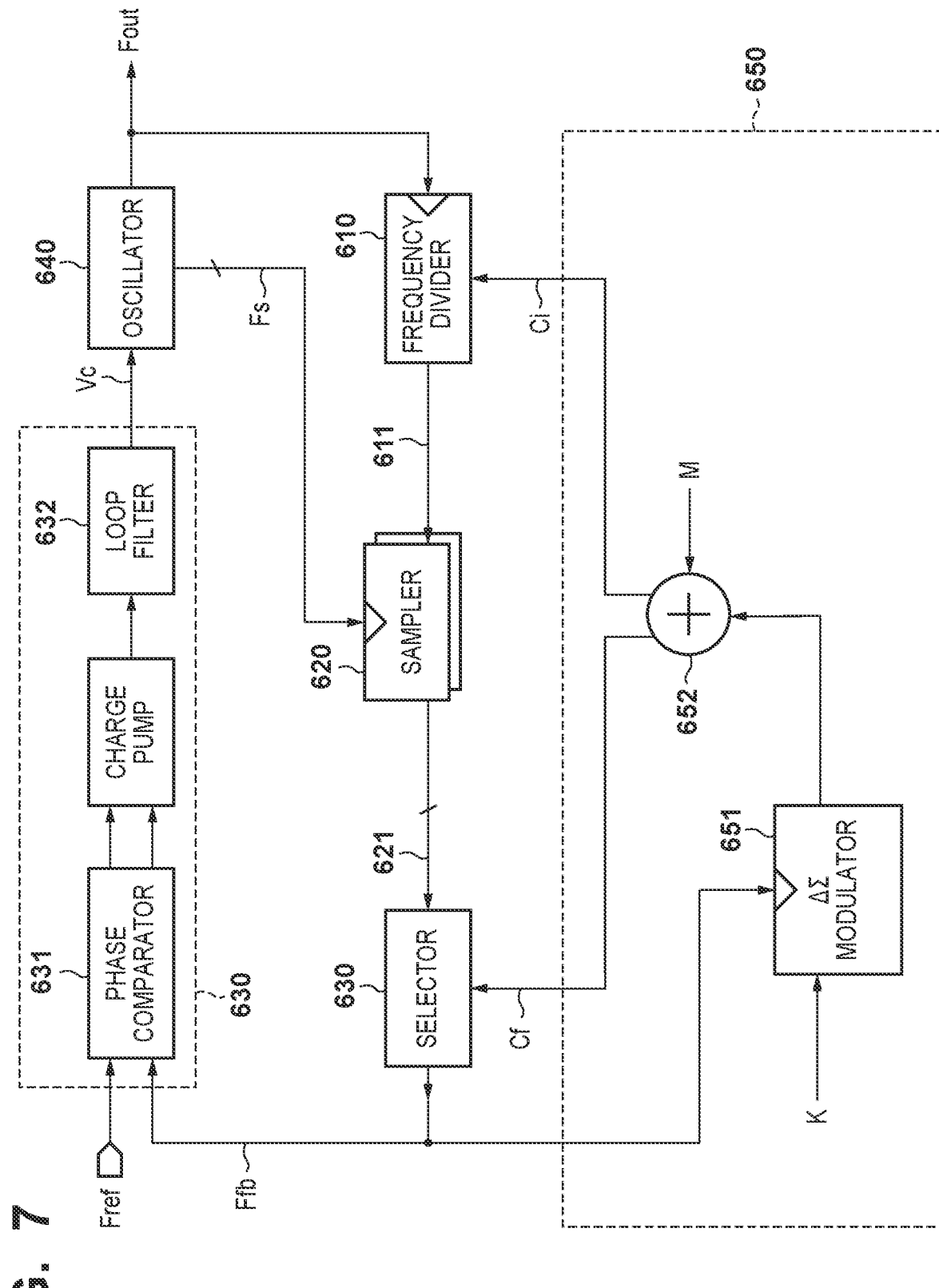
FIG. 7 is a block diagram illustrating a frequency synthesizer equipped with a conventional fractional frequency divider.

FIG. 6 is a state transition diagram for the integer frequency divider 161 of FIG. 1. The integer frequency divider 161, in the state in which the edge of the integer frequency division signal S162 is outputted (state 1), determines whether to divide the frequency by two or to divide the frequency by three and branches the signal into the following states. As illustrated in FIG. 6, even if the divide-by-two frequency division ratio is set while in the state transition of the divide-by-three frequency division ratio, there is a possibility that the frequency division will not be correctly performed and the integer frequency divider 161 will operate abnormally. That is, after transitioning to the state 1, the integer code DIV_con needs to be set for one cycle of the input clock S141.

In the frequency synthesizer 100 according to the present embodiment, the integer frequency division signal S162 is outputted at times of edges of the input clock S141. The integer code DIV_con is updated at times of the edges of the integer frequency division signal S162. The integer frequency divider 161 refers to the integer code DIV_con at timings of edges of the input clock S141. That is, the integer frequency divider 161 refers to the integer code DIV_con at timings of edges of the input clock S141, and the integer code DIV_con is outputted at a timing of an edge one cycle back in the input clock S141. Therefore, the timing of application for the signal path from the integer frequency divider 161 to the integer frequency division signal S162 to the phase accumulator 166 to the integer code DIV_con to the integer frequency divider 161 is the time for one cycle of the input clock S141. The relationship between the phase difference between the input clock S141 and the integer frequency division signal S162 is constant regardless of the integer code DIV_con. Therefore, in the present embodiment, a relatively large margin can be provided for the effective time (setup time) when capturing the integer code DIV_con by the input clock S141. As a result, the timing design of the circuit is facilitated, and the operating frequency can be increased while maintaining the stability to the operation.

Incidentally, the hold time when the integer code DIV_con is captured by the input clock S141 may be adjusted by delaying the signal path as required. The relationship between the phases of the fractional frequency division signal S150 and the integer frequency division signal S162 depends on the fraction code SEL_con, and therefore changes temporally. Therefore, the effective time (setup time) for when capturing the integer part output code SUMI and the fractional part output code SUMF in the phase accumulator 166 by the integer frequency division signal S162 is smaller than one cycle of the integer frequency division signal S162. More specifically, the cycle of the input clock S141 is reduced by one cycle. For example, when the operation of the integer frequency divider 161 is divided by two, the effective period (setup time) is one cycle of the input clock S141. As described above, the effective time (setup time) for when capturing the integer part output code SUMI and the fractional part output code SUMF by the integer frequency division signal S162 is reduced by one cycle with respect to the cycle of the integer frequency division signal S162. However, since the frequency of the integer frequency division signal S162 is lower than the frequency of the input clock S141, timing design is not a problem.

Further, in the frequency synthesizer 100 according to the present embodiment, since the setting of the frequency division ratio is updated immediately after an edge of the integer frequency division signal S162 is output, the above condition can be satisfied. In other words, the timing between the integer code DIV_con and the input clock S141 can be easily designed, and correct operation can be achieved.

The configuration and operation of the frequency synthesizer 100 according to embodiments have been described above. It will be understood by those skilled in the art that the embodiments are illustrative and that various modifications can be made to each component or combination of processes, and that such modifications are within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-025789, filed Feb. 15, 2019, which is hereby incorporated by reference herein in its entirety.

What is claimed is:

1. A fractional frequency divider, comprising:
a fractional frequency divider circuit configured to, by using an integer frequency division signal obtained by dividing an input signal by an integer frequency division ratio, generate a fractional frequency division signal into which the input signal is divided by a fraction frequency division ratio;
a latch circuit configured to capture a frequency control signal representing a specified fraction frequency division ratio in synchronization with the fractional frequency division signal; and
a control circuit configured to generate an integer control signal for setting an integer frequency division ratio corresponding to a specified fraction frequency division ratio in synchronization with an integer frequency division signal, based on a captured frequency control signal, wherein
the fractional frequency divider circuit is configured to update the integer frequency division ratio by referring to the integer control signal in synchronization with the input signal.

2. The fractional frequency divider according to claim 1, wherein the control circuit is configured to delay the integer control signal in synchronization with the integer frequency division signal.

3. The fractional frequency divider according to claim 2, wherein the control circuit is configured such that the specified fraction frequency division ratio is reflected in the fractional frequency division signal at least one cycle delayed in fractional frequency division signal cycles after the latch circuit captures the frequency control signal.

4. The fractional frequency divider according to claim 1, wherein
the fractional frequency divider circuit includes
an integer frequency divider circuit configured to generate the integer frequency division signal by dividing the input signal by the integer frequency division ratio,
a multi-phase generation circuit configured to generate a multi-phase signal having the same frequency as a frequency of the generated integer frequency division signal, and
a selection circuit configured to generate the fractional frequency division signal based on the generated multi-phase signal, wherein
the control circuit generates a selection control signal for selecting a signal having a phase corresponding to a specified fraction frequency division ratio of the multi-phase signal, based on the captured frequency control signal, and
the selection circuit generates the fractional frequency division signal by selecting a signal from among multi-phase signals based on the selection control signal.

5. The fractional frequency divider according to claim 4, wherein the input signal is one clock signal among multi-phase clock signals, and
the multi-phase generation circuit generates the multi-phase signal based on the integer frequency division signal and the multi-phase clock signal.

6. The fractional frequency divider according to claim 4, wherein the control circuit is configured to delay the selection control signal in synchronization with the integer frequency division signal.

7. The fractional frequency divider according to claim 6, wherein the control circuit delays the selection control signal by a flip-flop clocked by the integer frequency division signal.

8. The fractional frequency divider according to claim 4, wherein the integer frequency divider circuit is a multi-modulus divider.

9. The fractional frequency divider according to claim 1, further comprising a delta-sigma modulator configured to convert a frequency control word into the frequency control signal for specifying the fraction frequency division ratio.

10. The fractional frequency divider according to claim 4, wherein the integer frequency divider circuit has a signal line for outputting the integer frequency division signal to the multi-phase generation circuit and the control circuit.

11. A frequency synthesizer, comprising:
a fractional frequency divider;
a comparison circuit configured to compare a phase of a reference signal with a phase of a fractional frequency division signal;
a charge pump configured to generate a current corresponding to a comparison result in the comparison circuit;
a loop filter configured to control a voltage of an output signal by charging/discharging the current generated by the charge pump; and
a voltage controlled oscillator configured to generate an input signal having a frequency corresponding to a voltage of the output signal of the loop filter, wherein
the fractional frequency divider comprises
a fractional frequency divider circuit configured to, by using an integer frequency division signal obtained by dividing the input signal by an integer frequency division ratio, generate a fractional frequency division signal into which the input signal is divided by a fraction frequency division ratio;
a latch circuit configured to capture a frequency control signal representing a specified fraction frequency division ratio in synchronization with the fractional frequency division signal; and wherein
a control circuit configured to generate an integer control signal for setting an integer frequency division ratio corresponding to a specified fraction frequency division ratio in synchronization with the integer frequency division signal, based on a captured frequency control signal, and wherein
the fractional frequency divider circuit is configured to update an integer frequency division ratio by referring to an integer control signal in synchronization with an input signal.

12. The frequency synthesizer according to claim 11, wherein the control circuit is configured to delay the integer control signal in synchronization with the integer frequency division signal.

13. The frequency synthesizer according to claim 12, wherein the control circuit is configured such that the specified fraction frequency division ratio is reflected in the fractional frequency division signal at least one cycle delayed in fractional frequency division signal cycles after the latch circuit captures the frequency control signal.

14. The frequency synthesizer according to claim 11, wherein
the fractional frequency divider circuit includes
an integer frequency divider circuit configured to generate the integer frequency division signal by dividing the input signal by the integer frequency division ratio,
a multi-phase generation circuit configured to generate a multi-phase signal having the same frequency as a frequency of the generated integer frequency division signal, and
a selection circuit configured to generate the fractional frequency division signal based on the generated multi-phase signal, and wherein
the control circuit generates a selection control signal for selecting a signal having a phase corresponding to the specified fraction frequency division ratio of the multi-phase signal, based on the captured frequency control signal, and
the selection circuit generates the fractional frequency division signal by selecting a signal from among multi-phase signals based on a selection control signal.

15. The frequency synthesizer according to claim 14, wherein
the input signal is one clock signal among multi-phase clock signals, and
the multi-phase generation circuit generates the multi-phase signal based on the integer frequency division signal and the multi-phase clock signal.

16. The frequency synthesizer according to claim 14, wherein the control circuit is configured to delay the selection control signal in synchronization with the integer frequency division signal.

17. The frequency synthesizer according to claim 16, wherein the control circuit delays the selection control signal by a flip-flop clocked by the integer frequency division signal.

18. The frequency synthesizer according to claim 14, wherein the integer frequency divider circuit is a multi-modulus divider.

19. The frequency synthesizer according to claim 11, further comprising a delta-sigma modulator configured to convert a frequency control word into the frequency control signal for specifying the fraction frequency division ratio.

20. The frequency synthesizer according to claim 14, wherein the integer frequency divider circuit has a signal line for outputting the integer frequency division signal to the multi-phase generation circuit and the control circuit.

* * * * *